United States Patent [19]

Stoll et al.

[11] Patent Number: 5,467,080
[45] Date of Patent: Nov. 14, 1995

[54] SECURITY ARRANGEMENT INTENDED FOR OPENING AND/OR CLOSING OF DOORS IN PARTICULAR FOR AN AUTOMOTIVE VEHICLE

[75] Inventors: Daniel Stoll, Neuchatel; Daniel Clauss, Peseux, both of Switzerland

[73] Assignee: SMH Management Services AG, Biel, Switzerland

[21] Appl. No.: 103,796

[22] Filed: Aug. 10, 1993

[30] Foreign Application Priority Data

Aug. 11, 1992 [FR] France ................................ 92 09982

[51] Int. Cl.6 ............................. G06F 7/04; H03K 17/94
[52] U.S. Cl. ...................... 340/825.31; 340/310; 341/34
[58] Field of Search ..................... 340/825.31, 825.32; 307/10.2, 10.4; 235/382, 382.5; 341/22, 27, 34

[56] References Cited

U.S. PATENT DOCUMENTS

| | | | |
|---|---|---|---|
| 3,764,982 | 10/1973 | Kidnocker, Jr. ........................ | 340/147 |
| 4,205,325 | 5/1980 | Haygood et al. ................... | 340/825.32 |
| 4,609,780 | 9/1986 | Clark .............................. | 179/2 |
| 4,638,292 | 1/1987 | Mochida et al. ................... | 340/825.32 |
| 4,682,062 | 7/1987 | Weinberger ........................ | 307/10.4 |
| 4,719,460 | 1/1988 | Takeuchi et al. .................. | 340/825.31 |
| 4,809,199 | 2/1989 | Burgess et al. .................... | 340/825.31 |
| 4,878,057 | 10/1989 | Kompanek et al. .................. | 341/34 |
| 5,241,488 | 8/1993 | Chadima, Jr. et al. .............. | 364/708.1 |

FOREIGN PATENT DOCUMENTS

| | | |
|---|---|---|
| 0162132 | 11/1985 | European Pat. Off. . |
| 0210386 | 6/1986 | European Pat. Off. . |
| 0292796 | 11/1988 | European Pat. Off. . |
| 2067752 | 8/1971 | France . |

Primary Examiner—Alyssa H. Bowler
Assistant Examiner—Mark H. Rinehart
Attorney, Agent, or Firm—Griffin, Butler Whisenhunt & Kurtossy

[57] ABSTRACT

The invention concerns a security arrangement intended for the opening and/or closing of at least one door of an automotive vehicle, characterized in that it includes: at least one control keyboard (2) integrated into the coach-work of the vehicle and intended for the introduction of an opening and/or closing code, said keyboard being provided with sensing elements (6) responsive to the touch and furnishing a code corresponding to the actuated keys, a circuit (30, 32, 34, 44) adapted to generate a control signal in response to said code furnished by the control keyboard; and actuating means (36, 38) controlled by said control signal and assuring the latching and/or unlatching of said door.

9 Claims, 2 Drawing Sheets

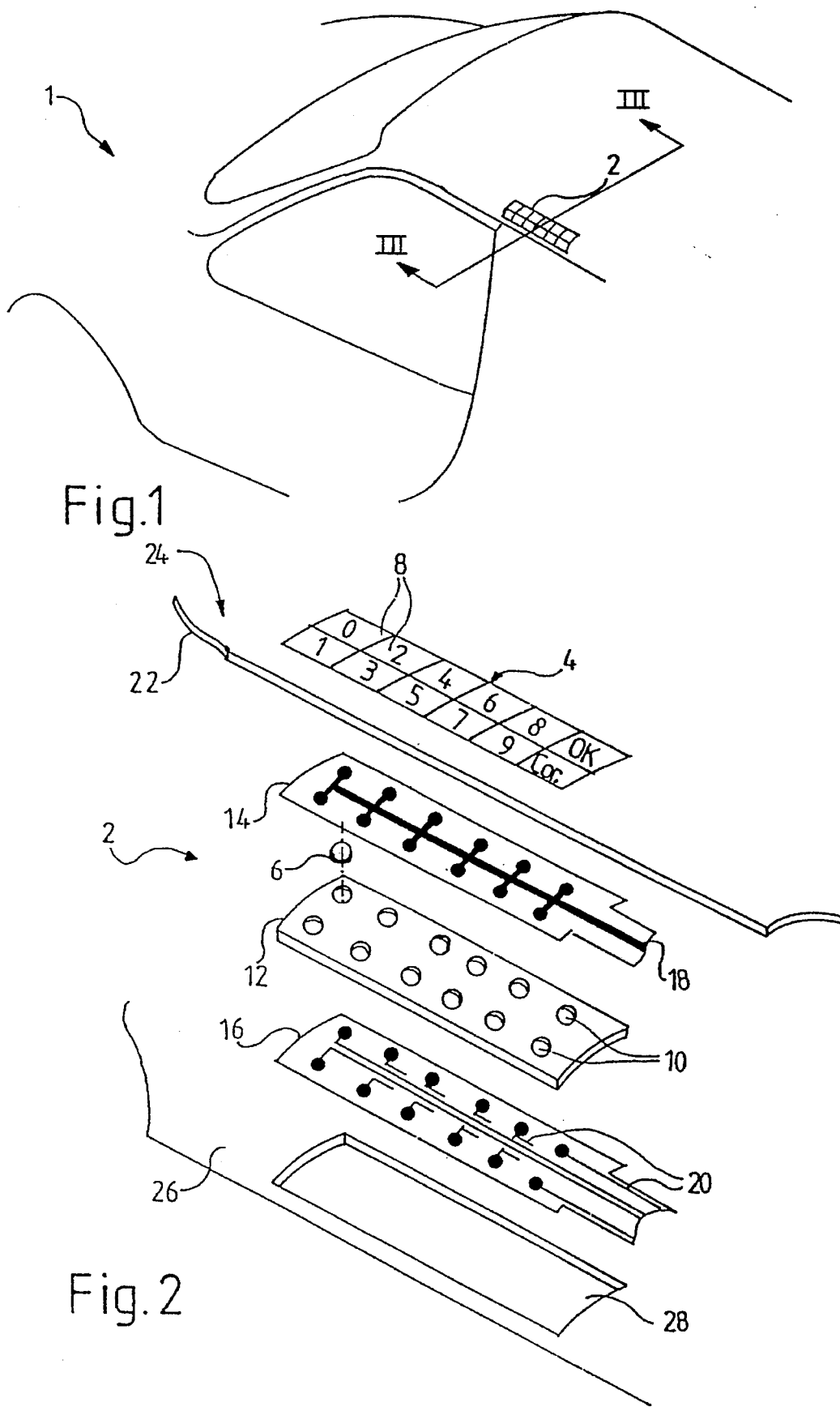

SECURITY ARRANGEMENT INTENDED FOR OPENING AND/OR CLOSING OF DOORS IN PARTICULAR FOR AN AUTOMOTIVE VEHICLE

The present invention concerns a security arrangement intended for door opening and closing for an automotive vehicle or the like and more specifically such an arrangement including an electronic lock provided with a control keyboard intended for the introduction of a digital or alphanumeric opening code.

BACKGROUND OF THE INVENTION

Among the best known security arrangements for automotive vehicle door opening and/or closing, there may be mentioned known lock arrangements including a latching and unlatching mechanism manipulated by a key identical or not to the anti-theft key for the steering and the starter contact and radio-frequency or infrared arrangements which enable the remote control of the latching and/or unlatching of doors or the like with the help of a transmitter.

Known lock arrangements with a key exhibit numerous drawbacks.

Effectively, such known arrangements necessitate providing an opening for the introduction of the key for each door. Such an opening, although generally including a blocking arrangement, does not assure complete water-tightness of the lock mechanism. Such opening is often not only the cause of jamming, in particular by frost in very cold periods, but also offers an easy route to burglars and vandals for forcing and/or damaging the lock. Moreover, as with all locks, it is necessary to have available a duplicate of the key in order to be able to use the vehicle in case of loss of such latter.

Radio frequency or infrared arrangements are, in general, used in parallel with the known key locking arrangements for which reason they do not enable to clear up all the drawbacks mentioned hereinabove.

The present invention thus has as principal purpose to overcome the drawbacks of the prior art mentioned hereinabove in providing a security arrangement intended for the opening and/or closing of doors, in particular for an automotive vehicle or the like, protected against theft and vandalism and which furthermore requires no separable control element such as a key or a transmitter.

SUMMARY OF THE INVENTION

To this effect, the invention has as object a security arrangement intended for the opening and/or closing of at least one door of an automotive vehicle, characterized in that it includes:

- at least one control keyboard integrated into the coachwork of the vehicle and intended for the introduction of an opening and/or closing code, said keyboard being provided with sensing elements responsive to the touch and furnishing a code corresponding to the actuated keys,
- a circuit adapted to generate a control signal in response to said code furnished by the control keyboard; and
- actuating means controlled by said control signal and assuring the latching and/or unlatching of said door.

Thanks to such characteristics, the security arrangement does not exhibit any element attached to the exterior of the vehicle. Furthermore, it is watertight and consequently particularly reliable whatever be the climatic conditions under which it is employed or the type of attack to which it may be subjected.

According to an advantageous characteristic of the invention, the keyboard is arranged under the vehicle roof.

Thus, the keyboard is located at a height which suits the greatest number of users so that such latter can comfortably manipulate it without having to lean or to lower themselves into an uncomfortable position.

According to a preferred embodiment of the invention, the sensing elements of the control keyboard include piezo-electric elements.

The use of such piezo-electric sensors in the security arrangement of the invention enables such latter to be liberated from the use of all movable parts appearing at the exterior of the vehicle and thus to improve the appearance of the vehicle while guaranteeing great security of operation of the arrangement and great efficiency against attempts of theft and/or vandalism.

Other characteristics and advantages of the invention will appear more clearly upon reading the following description of a specific embodiment of the security arrangement, such description being established as purely illustrative in connection with the attached drawings.

BRIEF DESCRIPTION OF THE DRAWINGS

FIG. 1 shows schematically an example of the disposition of a security arrangement of the invention in an automotive vehicle;

FIG. 2 shows the details of a control keyboard used in an embodiment of the arrangement of the invention as well as its assembly on the coach work of the vehicle;

DESCRIPTION OF THE PREFERRED EMBODIMENT

In referring initially to FIG. 1, there is seen an example of disposition of a keyboard 2 forming part of the security arrangement of the invention and which is in particular intended to control the opening/closing of the front left door of an automotive vehicle 1 shown schematically and partially.

Such a disposition is not obligatory and, as is well understood, the keyboard can be placed in any other appropriate place, for example on the door itself. There could also be provided as many keyboards as the vehicle has doors, including a keyboard for the baggage compartment, this without preventing the provision of a centralized locking and unlocking of all the doors and/or of the trunk from a single keyboard or from any keyboard, for example that which is located close to the driver's door.

According to a characteristic of the invention, the keyboard or keyboards are integrated under the coachwork of the vehicle, for example under the roof of the vehicle and are of the "grazing touch" type, so that the coachwork remains having a generally smooth aspect.

Having no functional part attached onto the exterior of the vehicle, the representation of the control keyboard or keyboards with their keys is identified on the external surface of the coachwork by any appropriate means, such as a picture type decoration 4, which will be provided opposite the place where the keyboard will be integrated. The means of showing the keyboard as well as the keys themselves are numerous and varied. Nevertheless, it is preferred to use an identification means such as texturing of the surface which enables employment of the keyboard in the absence of exterior lighting, in particular at night.

Figure 3:
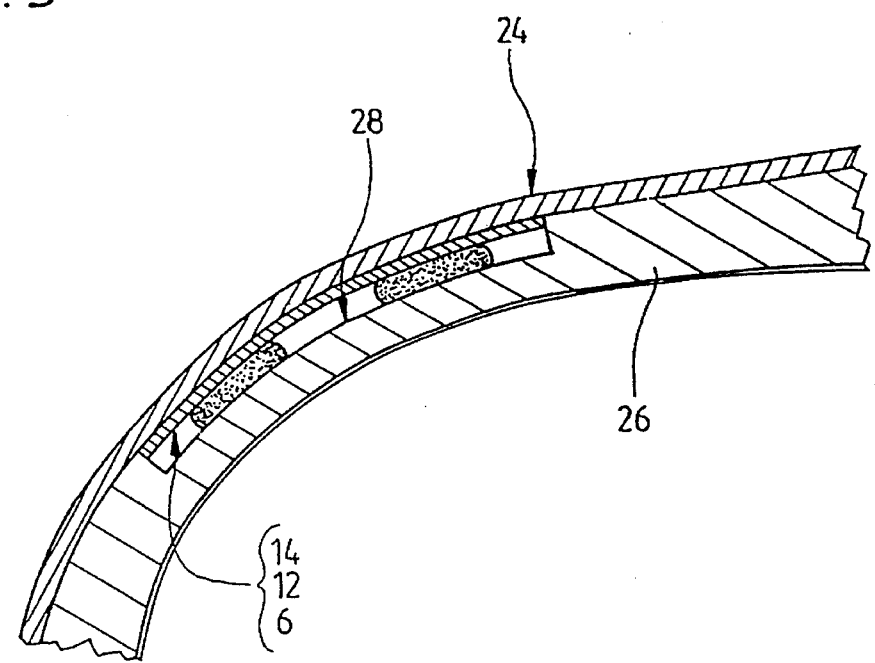
FIG. 3 shows a cross-section according to line I—I of FIG. 1.

The detail of the control keyboard 2 as well as its assembly in vehicle 1 are shown on FIGS. 2 and 3. The keyboard itself can be of the type described in the European patent number 0 210 386 of the Dynalab Company entitled "Folientastatur mit Piezoelektrischen Tasten".

Such keyboard includes a plurality of piezo-electric tablets 6, namely one tablet per key 8 of the keyboard 2 arranged in housings 10 of an intermediate sheet 12 formed of a rigid material and serving as spacer and two films 14 and 16 bearing conductive tracks 18, 20 enabling for one of them (film 14) to connect a metallized face of piezo-electric tablets 6 to conductor 18 and for the other (film 16), each of the other metallized faces of the piezo-electric tablets to conductors 20. The different elements of the keyboard are assembled as a sandwich and mounted on the interior surface 22 of a coachwork element 24 of vehicle 1 and opposite the artwork 4 (or any other identifying element) of keyboard 2. It will be noted that such keyboard elements are mounted in a manner to be maintained in close contact with surface 22.

The coachwork element 24 is sufficiently thin so that it may be deformed at the place of a given key of the keyboard responsive to the pressure of a finger. Care in particular will be taken so that the rigidity of the element 24 is such that it permits local deformation at the place onto which pressure is exerted in order to bring about actuation of the single piezo-electric tablet corresponding to the key which is pressed.

Such actuation is manifested by the appearance of a voltage between the common conductor 18 and that of the conductors 20 which correspond to the actuated tablet. In order to obtain maximum efficiency, the keyboard will preferably be mounted between said surface 22 and a rigid and undeformable element 26 forming part of the internal infrastructure of the coachwork in which has been provided a cavity 28 of appropriate dimensions. Keyboard 2, for example, is directly secured to surface 22 by means of a layer of glue on the one hand and at the bottom of cavity 28, by means of two strips of glue arranged in parallel and facing the piezo-electric tablets. The glue used, as is well understood, will be of a type exhibiting great hardness once dry.

The keyboards with piezo-electric elements lend themselves particularly well to the application envisaged by the present invention. Nevertheless, there can be envisaged other types of known keyboards exhibiting the particularity of including no moving part and capable of easily being integrated into an external element of the vehicle.

By way of example, a keyboard could be used of the type called "capacitive keys" and consisting of two intersecting networks of conductors maintained at a slight distance from one another by a dielectric material. A contact of the finger at a point of intersection of the double network has as effect to locally modify the capacity which modification can be detected by an appropriate electronic circuit. Such a keyboard can be formed in the windows of the vehicle or again in an element of the coachwork so long as the latter is of an insulating material.

Another example of keyboard can consist in the use of a keyboard called "resistor keys" of the type of that described in U.S. Pat. No. 4,451,714 in the name of F. N. Eventoff et al. consisting of two intersecting networks of conductors maintained at a slight distance from one another by a semi-conductor material sensitive to pressure. A contact of the finger at a point of intersection of the double network has as effect to modify locally the resistance of the conductors, which modification can be detected by an appropriate electronic circuit.

Figure 4:
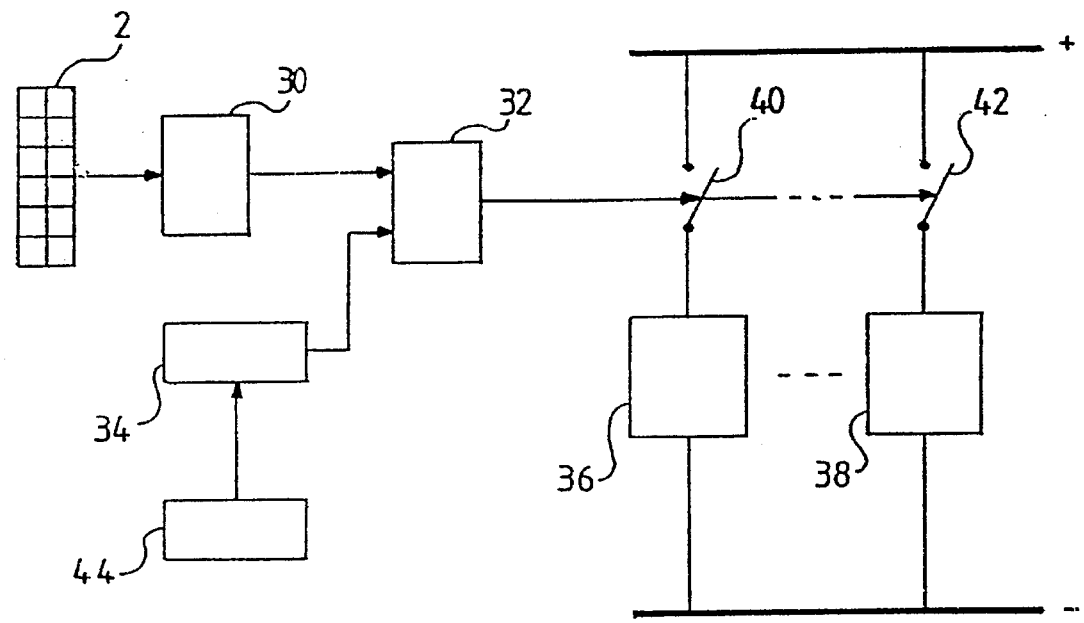
FIG. 4 shows a functional schematic of the security arrangement of the invention.

An example of the functional schematic of the security arrangement of the invention is shown on FIG. 4.

The output conductors of keyboard 2 are coupled to a decoding circuit 30. The output code of circuit 30 is applied to a comparator 32 which also receives one or several codes provided by a memory register 34. When the code introduced and the code or codes of the register 34 are identical, a control signal is transmitted to one or several actuators 36, 38 via the respective switches 40 and 42. In the application as envisaged, actuator 36 is for example an electromagnet which assures latching and/or unlatching of the doors. To such end, there can be provided a code for the control of the latching, for example the simultaneous actuation of any three keys and another code for the unlatching, for example a combination of predetermined keys.

According to a particularly useful variant in order to counter every attempt of theft by break-in, the unlatching code introduced by keyboard 2 and corresponding to that which is memorized is also used for inhibiting the master switch or ignition contact of the vehicle. Thus, in FIG. 3, switch 42 is placed in series with the contact switch of the starter 38. Memory 34, containing the unlatching code must, to be sure, be able to be programmed either once and for all by the manufacturer or by the user in the light of his needs. In such latter case, it is necessary to provide a programmer 44 in order to introduce the code into memory 34. Such programmer can be a keyboard arranged within the vehicle.

It is evident that the embodiments described can undergo variants or modifications without departing from the framework of the invention.

The use of an arrangement such as that which has just been described exhibits many advantages over known systems of locks. In the first place, no additional element such as a key or a transmitter is required in order to control opening and/or closing, in particular of the doors of the automotive vehicle. Moreover, such an arrangement constitutes an effective protection against theft and break-ins since knowledge of the opening code is indispensable. It will also be noted that such an arrangement using a keyboard offers a greater number of different possible combinations than the key or transmitter systems.

What we claim is:

1. A security arrangement intended for the opening and/or closing of at least one door of an automotive vehicle, and which includes:

at least one control keyboard integrated into a coachwork body of the vehicle to have sensing elements located under a relatively small portion of a single structural sheet member forming a substantial portion of an outer layer of the coachwork body, said outer layer defining an unbroke exterior surface of said coachwork body, for responding to a touch at said exterior surface of said outer layer adjacent said keyboard for introduction of opening and closing codes, said control keyboard being provided with said sensing elements responsive to the touch at said exterior surface for furnishing codes corresponding to actuated keys, a circuit coupled to said sensing elements for generating control signals in response to said codes furnished by the control keyboard; and actuating means controlled by said control signal for assuring the latching and/or unlatching of said door.

2. A security arrangement as set forth in claim 1, in which said sensing elements are piezo-electric elements, said control keyboard being mounted under a part of the vehicle coachwork.

3. A security arrangement as set forth in claim 1, wherein the control keyboard is of the capacitive type and is mounted in an external element of the vehicle formed from an insulating material.

4. A security arrangement as set forth in claim 3, wherein said keyboard is formed in one of the windows of the vehicle.

5. A security arrangement as set forth in claim 1, wherein the control keyboard is of the resistive type.

6. A security arrangement as set forth in claim 1, said circuit including a memory in which is stored a reference code, said control signal being furnished only if the code introduced into the keyboard is identical to such reference code.

7. A security arrangement as set forth in claim 1, in which said control signal is additionally employed to close the contact control circuit of the vehicle starter.

8. A security arrangement as set forth in claim 1, wherein keys of the keyboard are graphically represented on the exterior surface of said outer layer of said coachwork body at said relatively small portion thereof adjacent said sensing elements.

9. A security arrangement as set forth in claim 8, wherein said graphic representations exhibit an outline in relief.

* * * * *